United States Patent
Wu et al.

(10) Patent No.: US 7,442,620 B2
(45) Date of Patent: Oct. 28, 2008

(54) METHODS FOR FORMING A TRENCH ISOLATION STRUCTURE WITH ROUNDED CORNERS IN A SILICON SUBSTRATE

(75) Inventors: Chia-Wei Wu, Taichung (TW); Jung-Yu Shieh, Hsinchu (TW); Ling-Wuu Yang, Hsinchu (TW)

(73) Assignee: Macronix International Co., Ltd. (TW)

( * ) Notice: Subject to any disclaimer, the term of this patent is extended or adjusted under 35 U.S.C. 154(b) by 225 days.

(21) Appl. No.: 11/423,859

(22) Filed: Jun. 13, 2006

(65) Prior Publication Data

US 2007/0287260 A1    Dec. 13, 2007

(51) Int. Cl.
*H01L 21/76* (2006.01)
(52) U.S. Cl. ............... 438/435; 438/424; 257/E21.549
(58) Field of Classification Search ............. 438/424, 438/435; 257/E21.549
See application file for complete search history.

(56) References Cited

U.S. PATENT DOCUMENTS

| | | | | |
|---|---|---|---|---|
| 5,989,978 | A | * | 11/1999 | Peidous ............... 438/436 |
| 6,180,493 | B1 | | 1/2001 | Chu |
| 2004/0126990 | A1 | | 7/2004 | Ohta |
| 2006/0292894 | A1 | * | 12/2006 | Vellaikal et al. ........ 438/787 |

* cited by examiner

*Primary Examiner*—Bradley K Smith
(74) *Attorney, Agent, or Firm*—Baker & McKenzie LLP (57) ABSTRACT

A process for forming STI regions comprises performing an In Situ Steam Generation (ISSG) radical conversion on a SiN liner layer within an STI trench in order to expose the top corner of the trench and simultaneously cause rounding the top corner of a liner oxide layer within the trench. The rounding of the liner oxide layer can prevent thinning of a subsequently formed gate oxide.

25 Claims, 9 Drawing Sheets

METHODS FOR FORMING A TRENCH ISOLATION STRUCTURE WITH ROUNDED CORNERS IN A SILICON SUBSTRATE

BACKGROUND

1. Field of the Invention

The embodiments described herein are directed to fabrication of integrated circuit devices, and more particularly to methods for forming a shallow trench isolation (STI) region in a semiconductor substrate during fabrication of an integrated circuit device.

2. Background of the Invention

As integrated circuits gets smaller and smaller, the need to provide isolation between devices comprising the integrated circuit has increased. The need for isolation between devices comprising today's integrated circuits is also affected by the increasing density of devices within each circuit. Today's integrated circuits comprised millions of transistors packed into ever smaller spaces. Without isolation between various devices comprising an integrated circuit, the performance of these integrated circuits would be affected by leakage current, and other parasitic effects that exists between the various transistors and devices.

In the fabrication of high-density circuits, shallow trench isolation (STI) structures have become prevalent, and are used almost as exclusively to provide isolation for conventional integrated circuit devices. STI is a method for forming isolation regions between devices on a semiconductor substrate used to form an integrated circuit. STI typically comprises anisotropically etching a semiconductor substrate to form a trench, and then depositing oxide material to fill the trench. Since the STI structure can be scaled, problems that affected previous isolation techniques can be avoided, making STI an ideal method for isolating, e.g. even submicron complimentary MOS devices.

As device geometries continue to shrink, and device densities continue to increase, problems with conventional STI processes have been exposed. For example, before the oxide material is deposited to fill the trench, a liner oxide layer can be formed so as to line the inside of trench. The oxide material deposited into the trench can then be formed into a compact insulation layer by heating the oxide material to a high temperature. But this process can result in stress on the active regions surrounding the trench. Accordingly, the compaction process is typically carried out in a nitrogen filled atmosphere rather than an oxygen filled atmosphere. By performing the step in a nitrogen filled atmosphere, oxidation of the trench sidewalls is prevented, which can reduce the accumulation of stress.

Unfortunately, using a nitrogen filled atmosphere results in an insulation layer inside the trench that is less compact. When the pad oxide layers defining the active areas around the trench are removed, e.g., using a hydrofluoric acid solution, the etching rate of the insulation layer inside the trench can be higher than that of the pad oxide layer. As a result, the combination of etching of the pad oxide layer with isotropic etching of the insulation layer within the trench can produce stress on the various layers at the top and bottom corners of the trench. This stress can produce a phenomenon known as dislocation, or dislocation effect. The dislocation effect can cause a lowering of the threshold voltage of devices formed in the active area as well as the formation of parasitic MOSFETs around the corners of the device formed in the active region. These parasitic MOSFETs can produce large leakage currents between devices.

In order to reduce the dislocation effect, a silicon nitride (SiN) layer is often formed over the oxide liner within the trench. The SiN layer prevents oxidation and allows the insulation layer formed within the trench to be formed in an oxygen filled atmosphere, which produces a more compact insulation layer within the trench. Unfortunately, the SiN layer can contribute to a thinning of a gate oxide layer formed in an active area adjacent to the trench. The thinning can reduce the available active area, because the thin gate oxide layer can result in undesirable parasitic and leakage currents when devices formed in the active region impinge, or are formed too close to the thinned gate oxide layer.

Figure 1A:
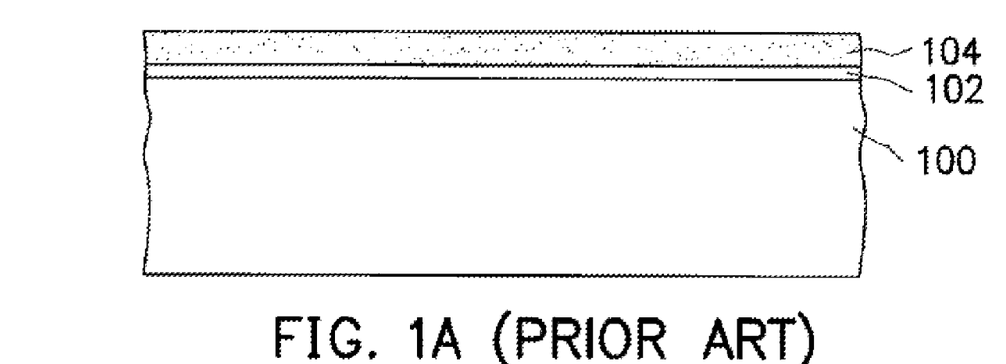
FIGS. 1A to 1F are schematic, cross-sectional diagrams showing the progression of manufacturing steps according to a conventional method of forming a STI region in a substrate.

FIGS. 1A-1F are schematic, cross sectional diagrams illustrating the progression of manufacturing steps for a conventional method for fabricating an STI structure using an SiN layer to reduce dislocation. First, as shown in FIG. 1A, a pad oxide layer 102 is formed over a silicon substrate 100 using a thermal oxidation method. Pad oxide layer 102 protects silicon substrate 100 against damages in subsequent processing operations. Thereafter, a silicon nitride mask layer 104 is formed over pad oxide layer 102.

Figure 1B:
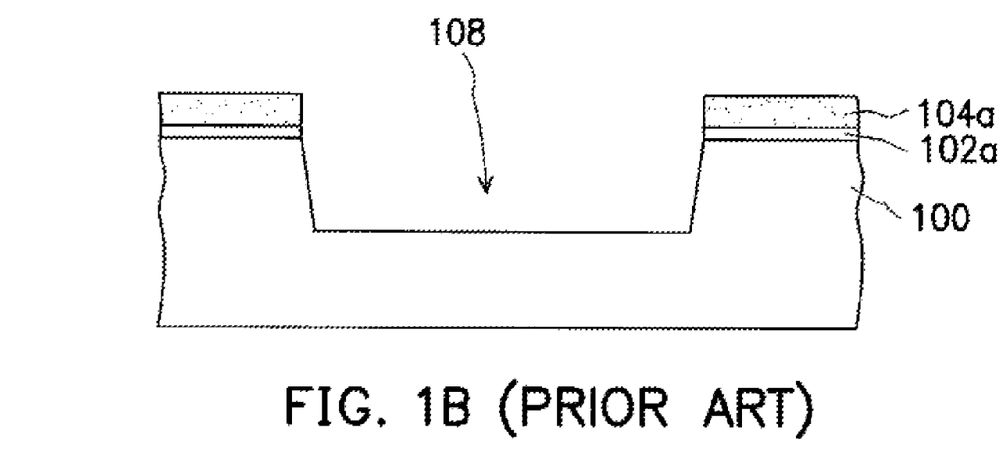

Next, as shown in FIG. 1B, conventional photolithography techniques are used to form trench 108. Hence, a patterned mask layer 104a and pad oxide layer 102a as well as a trench 108 are formed above substrate 100.

Figure 1C:
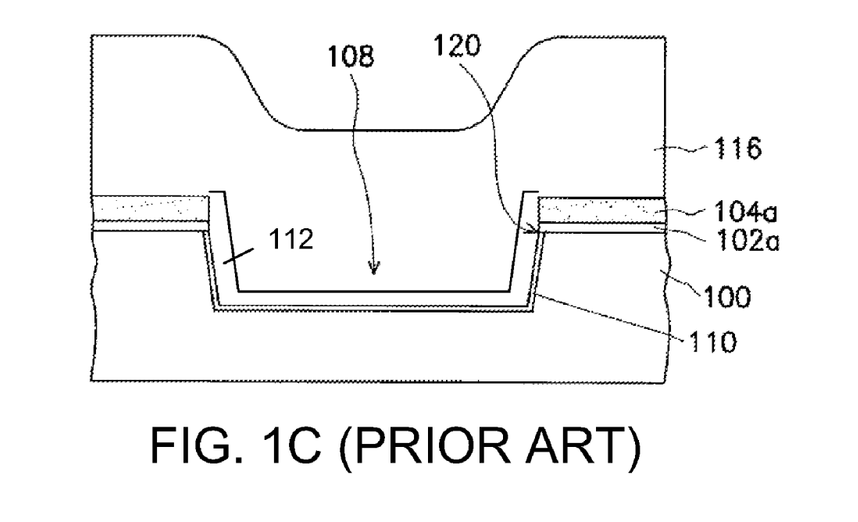

Next, as shown in FIG. 1C, a liner oxide layer 110 is formed on the exposed substrate surface of trench 108. As can be seen, liner oxide layer 110 extends from the bottom of trench 108 to the top corners 120 where it contacts pad oxide layer 102a. After liner oxide layer 110 is formed in trench 108, a silicon nitride film 112 can then be formed over liner oxide layer 110 within trench 108. Thereafter, insulating material is deposited into trench 108 and over silicon nitride layer 104a and silicon nitride film 112 to form an insulation layer 116. Insulation layer 116 can, for example, be a silicon oxide layer. Subsequently, substrate 100 is heated to a high temperature so that the silicon oxide material is allowed to densify into a compact insulation layer 116.

Figure 1D:
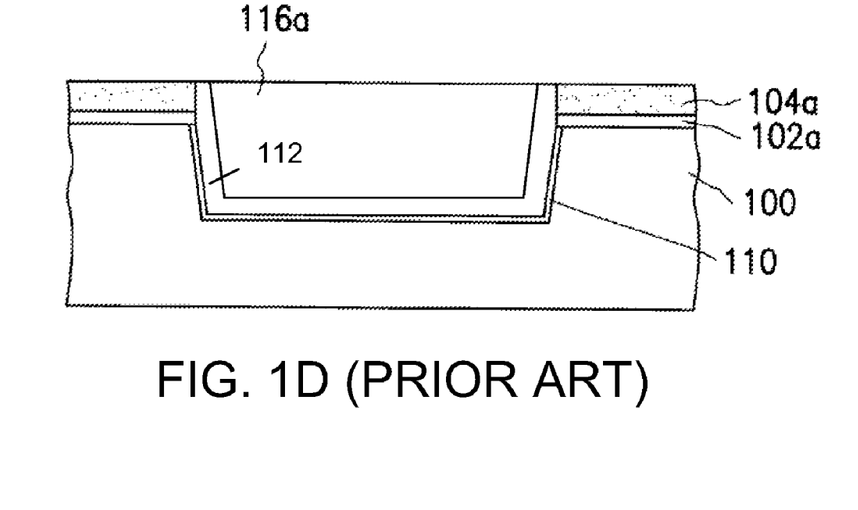

As illustrated in FIG. 1D, a CMP process can be carried out to remove portions of insulation layer 116 using silicon nitride layer 104a as a polishing stop layer, while retaining a portion of insulating layer of 116a within trench 108.

Figure 1E:
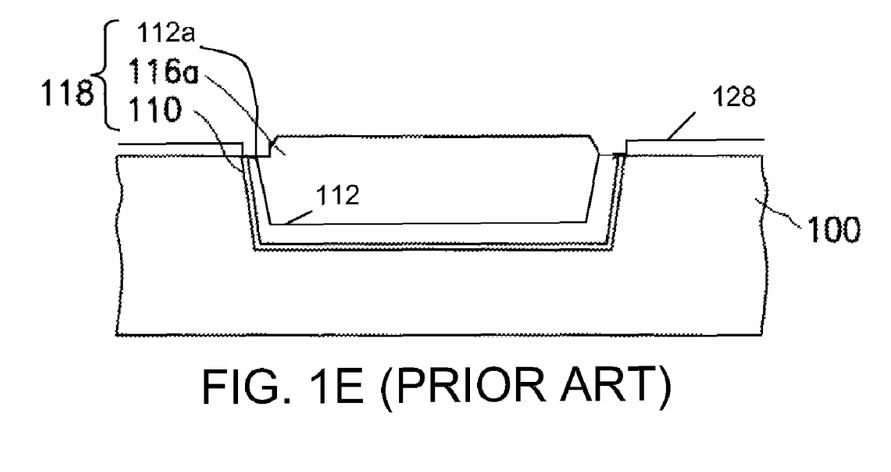

As shown in FIG. 1E, a hot phosphoric acid can then be applied to remove silicon nitride layer 104a, thereby exposing pad oxide layer 102a. A hydrofluoric (HF) acid solution can then be applied to remove pad oxide layer 102a. The remaining insulation layer 116a and liner oxide layer 110 within the trench 108 of the substrate 100 forms a complete device isolation region 118.

The surface of silicon substrate 100 can then be thermally oxidized to form a SAC oxide layer 128 over substrate 100. Impurity ions of the desired conductivity type can be implanted into the surface layer of silicon substrate 100 via the SAC oxide layer 128, and activated to form the desired conductivity type in the surface layer of silicon substrate 100.

Figure 1F:
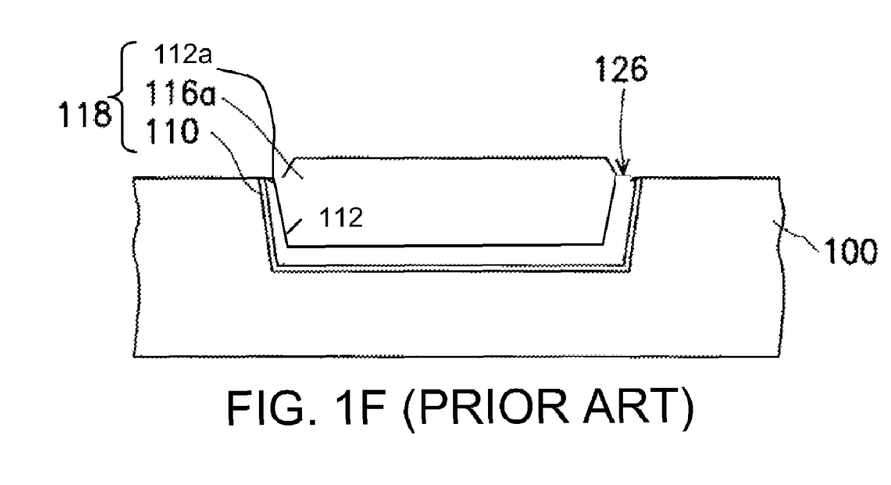

SAC oxide layer 128 can then be removed using a diluted hydrofluoric acid solution as illustrated in FIG. 1F.

Due to the presence of silicon nitride film 112, insulating layer 116a can be densified using an oxygen filled atmosphere. Unfortunately, the presence of silicon nitride film 112 can prevent removal off insulation layer 110 adjacent to the top corners 126 of trench 108, which can lead to subsequent thinning of the gate oxide layer as illustrated in FIG. 2.

Figure 2:
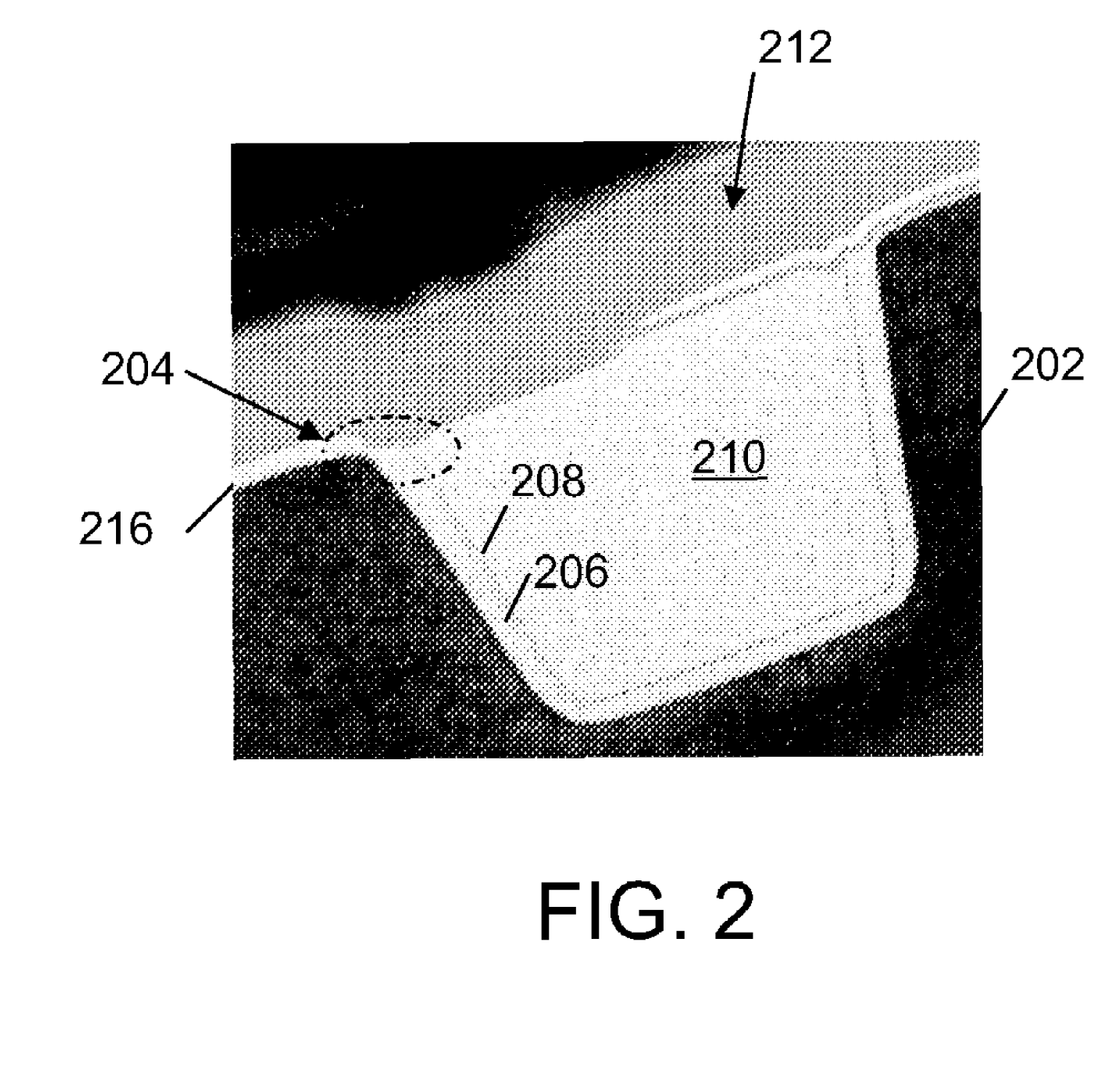
FIG. 2 is a TEM image illustrating the thinning of a gate oxide layer that can occur when using the process illustrated in FIGS. 3A to 3D.

FIG. 2 is a diagram illustrating a TEM image of an STI region 200 formed in a silicon substrate 202. As can be seen, STI structure 200 comprises a trench 212 filled with an insulating layer 210. Trench 212 is also lined with the liner oxide layer 206 and the silicon nitride film 208. As can be seen, gate oxide layer 216 has been thinned at the upper corner of trench 212 in region 204.

Thinning occurs because while silicon nitride film 112 is used to cap liner oxide layer 110 in order to decrease HDP thermal expansion and reduce isolation, it also caps the top corners of liner oxide layer 110. This affects the rounding of the top corners of liner oxide layer 110 and leads to the thinning illustrated in the TEM image of FIG. 2.

SUMMARY

A process for forming STI regions comprises performing an In Situ Steam Generation (ISSG) radical conversion on a SiN liner layer within an STI trench in order to expose the top corner of the trench and a liner oxide layer during etching of the sacrificial (SAC) oxide layer. The presence of the SiN liner can prevent dislocation by allowing the insulating layer formed in the trench to be formed in an oxygen filled atmosphere. Exposing the top corners of the liner oxide layer allows the liner oxide layer to be rounded at the top corner, which can prevent thinning of a subsequently formed gate oxide layer.

In one aspect, the ISSG process is performed with a hydrogen (H) radical content of between about 5% and 50%.

In another aspect, the ISSG process is performed at a temperature greater than 900° C.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

It will be understood that any dimensions, measurements, ranges, test results, numerical data, etc., presented below are approximate in nature and unless otherwise stated not intended as precise data. The nature of the approximation involved will depend on the nature of the data, the context, and the specific embodiments or implementations being discussed.

Figure 3A:
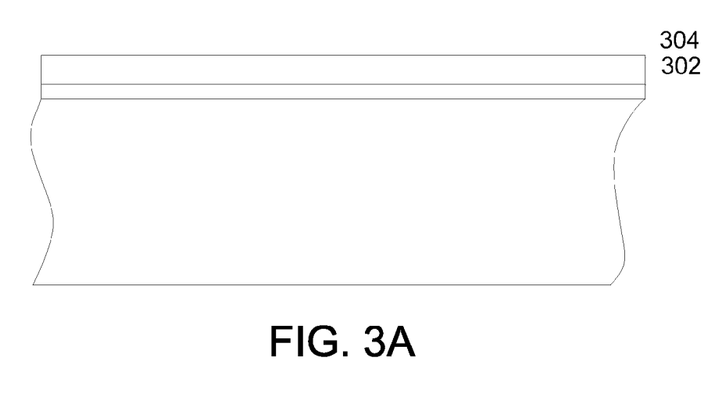
FIGS. 3A-3F are schematic, cross-sectional diagrams showing the progression of manufacturing steps for forming a STI region in a substrate in accordance with one embodiment.

FIGS. 3A through 3F are schematic, cross-sectional diagrams showing a progression of manufacturing steps for forming a STI region in a substrate in accordance with one embodiment. First, as shown in FIG. 3A, a pad oxide layer 302 is formed over a silicon substrate 300 using a thermal oxidation method. Pad oxide layer 302 protects silicon substrate 300 against damages in subsequent processing operations. Thereafter, a silicon nitride mask layer 304 is formed over pad oxide layer 302, e.g., using a low-pressure chemical vapor deposition (LPCVD) method.

Figure 3B:
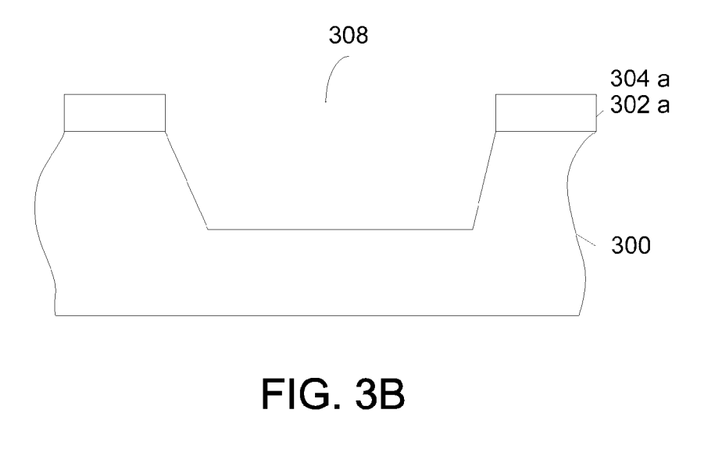

Next, as shown in FIG. 3B, a conventional method is used to deposit a photoresist layer (not shown) over mask layer 304. Mask layer 304, pad oxide layer 302 and silicon substrate 100 are then sequentially etched in accordance with conventional etching techniques. Hence, a patterned mask layer 304a and pad oxide layer 302a as well as a trench 308 are formed above substrate 300. The photoresist layer is can then be removed.

Figure 3C:
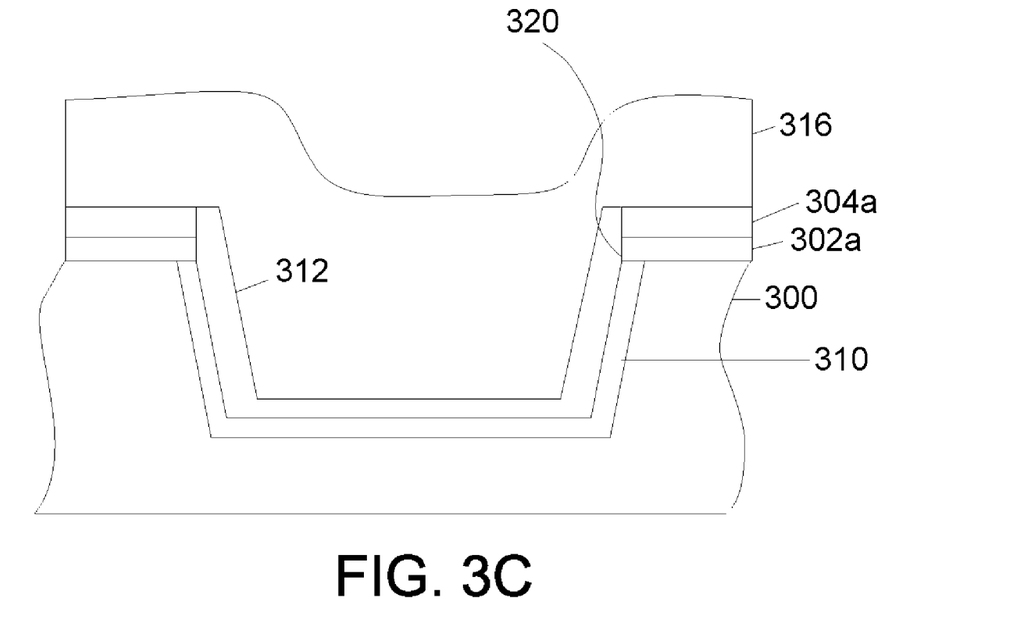

Next, as shown in FIG. 3C, high-temperature thermal oxidation is conducted to form a liner oxide layer 310 on the exposed substrate surface of trench 308. Liner oxide layer 310 extends from the bottom of trench 308 to the top corners 320 where it contacts pad oxide layer 302a. After liner oxide layer 310 is formed in trench 308, a silicon nitride (SiN) film, or layer 312 can then be formed over liner oxide layer 310 within trench 308. For example, in certain embodiments SiN layer 312 can be a $Si_3N_4$ layer.

It can be shown that the thickness of SiN layer 312 can affect the drain current for devices formed on the active regions on either side of trench 308. For example, as the thickness of SiN layer 312 goes up, so does the drain current. Further, increased thickness of the SiN layer 312 will produce a larger tensile stress, which can be shown to cancel out the compressive stress formed on liner oxide layer 310 by the densification of insulation layer 316. The thickness of SiN layer 312 is also dependent on the width of trench 308. As a result, the thickness of SiN layer 312 can be selected based on the width of trench 308 and the desired drain current.

SiN layer 312 can be formed, e.g., by low-pressure chemical vapor deposition (LPCVD) so as to cover the surface of liner oxide layer 310. For example, the LPCVD formation of SiN layer 312 can be performed at a temperature of about 650° C. using mixed gas of $SiCl_2H_2$ and $NH_3$ as a source gas. A SiN film formed by such thermal CVD can have a tensile stress of 1 GPa or larger. This stress has a direction opposite to that of stress of insulating layer 316 subject to a heat treatment process for making layer 316 dense.

In certain other embodiments, SiN layer 312 can be formed by thermal CVD using bis-Tertial butylaminosilane (BT- BAS) and ammonia (NH$_3$) as source gas. In such embodiments, the thermal CVD process can be carried out using a pressure of approximately 1.33 Pa to 1,330 Pa, substrate temperature of 550° C. to 580° C., a flow rate of BTBAS of about 5 sccm to 200 sccm, a flow rate of NH$_3$ of about 50 sccm to 200 sccm and a flow ratio (BTBAS):(NH$_3$) of about 1:1 to 2:20. For example, in one specific embodiment a pressure of 65 Pa, a flow rate of BTBAS of approximately 40 sccm, a flow rate of NH$_3$ of about 160 sccm and a flow ratio of about 1:4 is used.

Insulation layer 316 can then be formed over SiN mask layer 304a and SiN layer 312 as illustrated in FIG. 3C. Insulation layer 316 can be formed by HDP CVD using, for example, an inductive coupling plasma CVD system. The HDP silicon oxide insulating layer 316 can be formed by using a mixed gas of SiH$_4$ and oxygen, or mixed gas of tetraethoxysilane (TEOS) and ozone. The thickness of insulating layer 316 can be selected so that trench 308 is completely buried. In other embodiments, insulating layer 316 can be formed using a spin-on glass (SOG) coating type.

In other embodiments, insulation layer 316 can be formed using, for example, an atmospheric pressure chemical vapor deposition (APCVD) method. In still other embodiments, layer 316 can be formed using a high density plasma (HDP) CVD technique.

Figure 3D:
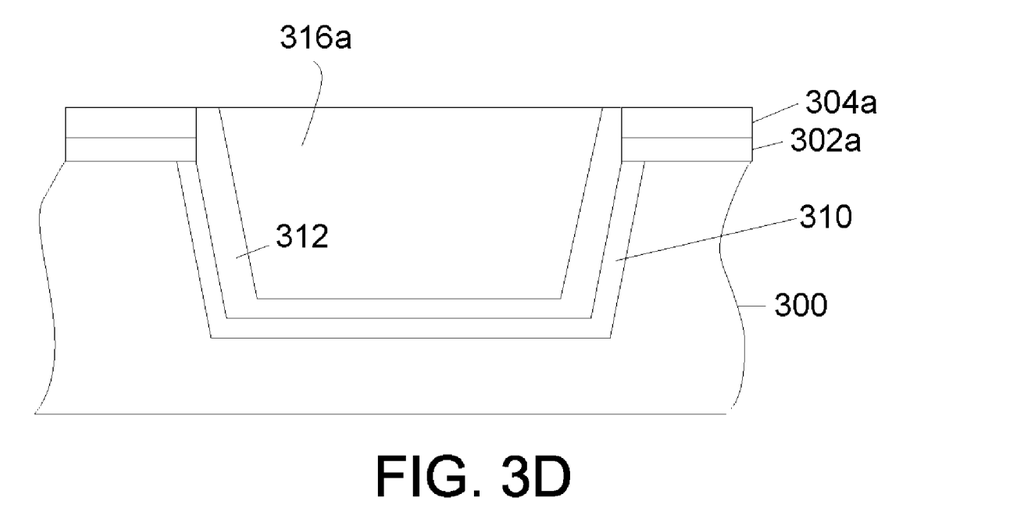

Subsequently, substrate 300 is heated to a high temperature so that the silicon oxide material is allowed to densify into a compact insulation layer 316. Thereafter, as shown in FIG. 3D, using silicon nitride layer 304a as a polishing stop layer, chemical-mechanical polishing (CMP) is carried out to remove a portion of the insulation layer 316 while retaining a portion within trench 308. The remaining insulating material inside trench 308 becomes an insulation layer 316a.

Figure 3E:
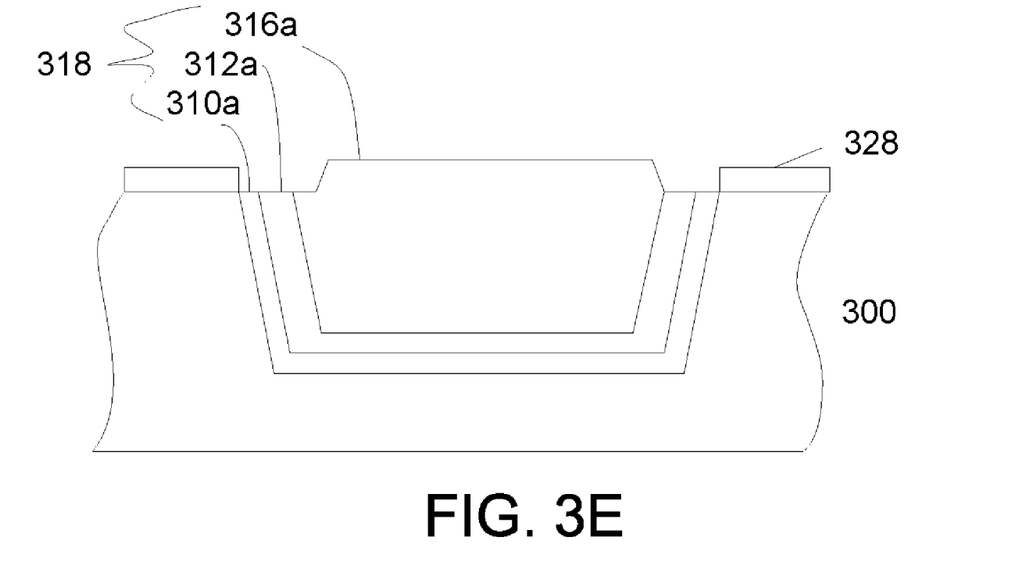

As shown in FIG. 3E, a hot phosphoric acid can then be applied to remove SiN mask layer 304a, thereby exposing pad oxide layer 302a. A hydrofluoric (HF) acid solution can be applied to remove pad oxide layer 302a. The remaining insulation layer 316a, SiN layer 312a, and liner oxide layer 310 within the trench 308 of the substrate 300 forms a complete device isolation region 318.

The surface of silicon substrate 300 can then be thermally oxidized to form a SAC oxide layer 328 over substrate 300. Again, impurity ions and the desired conductivity type can be implanted into the surface layer of silicon substrate 310 via the SAC oxide layer 328, and activated to form the desired conductivity type in the surface layer of silicon substrate 300.

In order to produce the rounded corners of liner oxide layer 310, the thermal oxidation of SAC oxide layer 328 is performed using an ISSG process. The ISSG radical converts a portion of SiN layer 312 into SiO2 in the upper corners of trench 308. The conversion of a portion of the SiN, e.g., Si$_3$N$_4$, into SiO$_2$ improves the efficiency of oxidation at the trench corner and enables rounding of the corners of liner oxide layer 310. The conversion of a portion of SiN layer 312 and the rounding of liner oxide layer 310 occurs simultaneously.

Figure 3F:
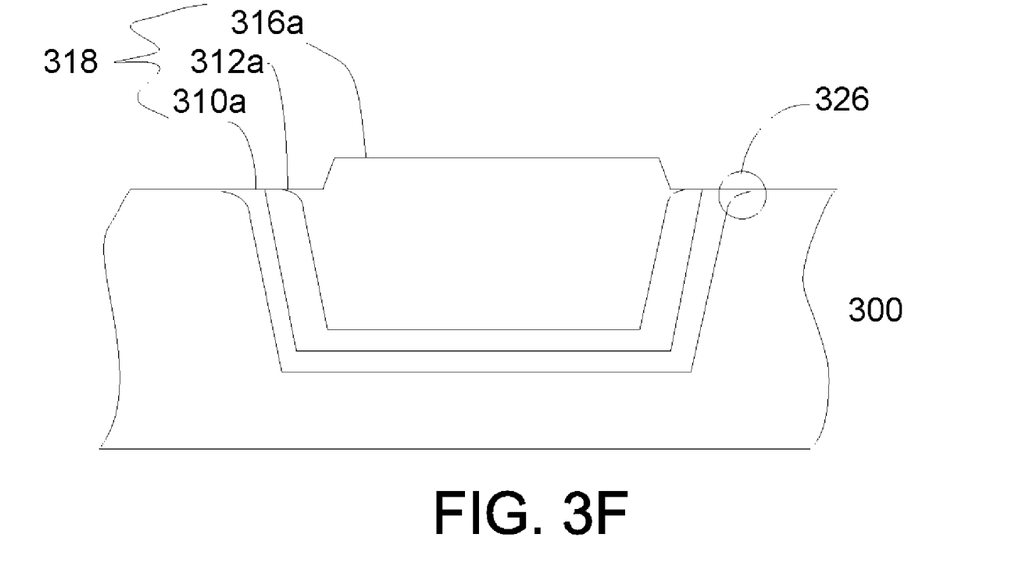

The combination of the wet etching of pad oxide layer 302a and the isotropic etching of insulation layer 316 can produce recess cavities in insulation layer 316 at the top corner of trench 308. The rounding effect combined with the recess cavities can prevent thinning of the gate oxide subsequently formed near the trench corner. The rounding of oxide layer 310 is illustrated in FIG. 3F. Thus, when SAC oxide layer 328 is etched using, e.g., a diluted hydrofluoric acid solution, the exposed liner oxide layer 310 will be rounded as illustrated in FIG. 3F.

The ISSG process is a wet oxidation process. The major oxidation source, can depending on the embodiment comprise OH, with a H radical content in a certain range as described below. A strong oxidation power is used to grow the SAC oxide and convert the nitrogen in SiN layer 312.

SiN liner layer 312 should have a sufficient thickness to prevent thinning. For example, SiN layer 312 should have a thickness in the range of about 10 angstroms to 100 angstroms. Further, the ISSG radical conversion process can be performed using hydrogen (H) radical content of about 5% to 50%. The temperature for ISSG growth of SAC oxide layer 328 should be above 900° C. For example, in one embodiment, a H radical content of 33% and a growth temperature of 1,050° C. is used during the ISSG radical conversion process.

Figure 4:
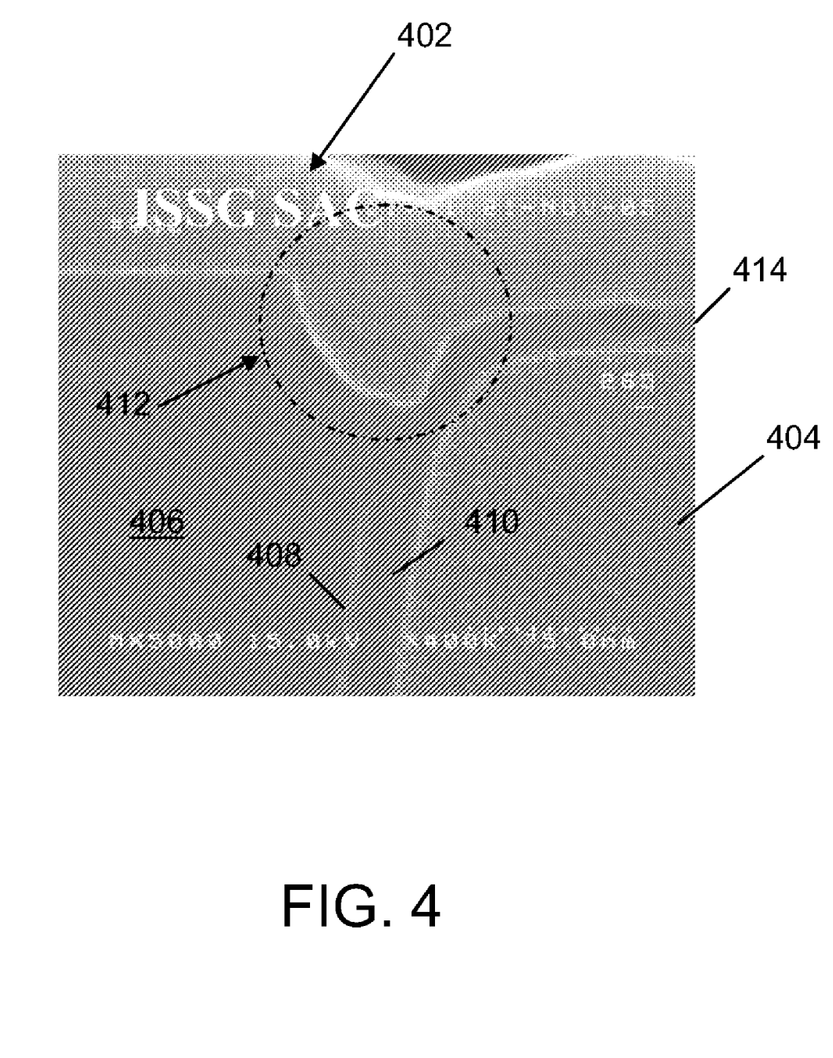
FIG. 4 is a SEM image illustrating a STI structure formed using the process of FIGS. 3A-3F.

FIG. 4 is a SEM image of a trench 402 formed in substrate 404 using the process of FIGS. 3A and 3F. Trench 402 is filled with an insulating layer 406, and is lined with a liner oxide layer 410 and SiN layer 408. As can be seen in regions 412, liner oxide layer 410 has been rounded but no thinning of gate oxide 414 has occurred.

Figure 5:
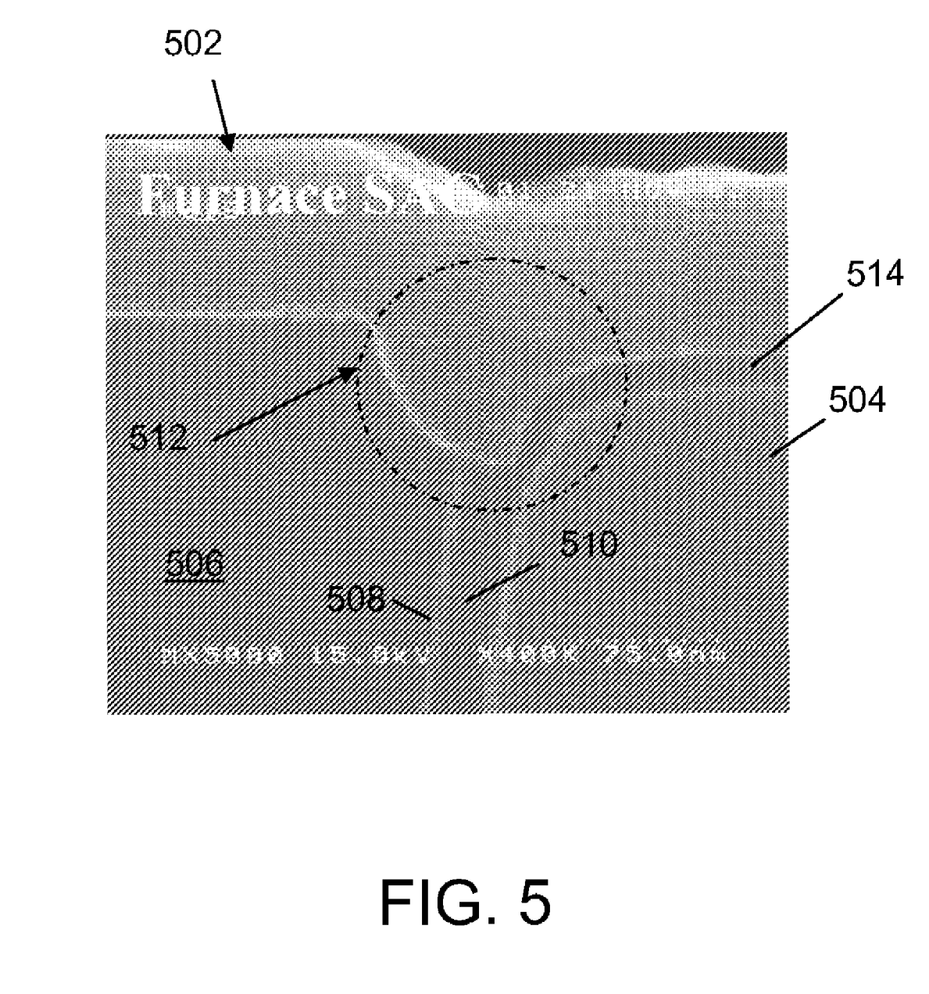
FIG. 5 is a SEM image illustrating a STI structure formed in a substrate that illustrates the thinning effect.

Conversely, FIG. 5 is a SEM image illustrating a trench 502 formed using a conventional process, i.e., a process wherein SAC oxide layer 328 is formed using a furnace. As can be seen in region 512, gate oxide layer 514 has been thinned significantly. Gate oxide 514 experiences thinning, because SiN layer 508 limits rounding of the corner of oxide layer 510.

Referring to FIG. 3F, SAC oxide layer 328 can be removed using a diluted hydrofluoric acid solution, leaving STI structure 318.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. In a semiconductor device comprising a silicon substrate, method for forming an isolation structure, comprising:
   forming a trench in the silicon substrate;
   lining the trench with a liner oxide layer;
   further lining the trench with a silicon nitride layer;
   filling the lined trench with an insulating layer;
   forming a sacrificial oxide layer over the silicon substrate adjacent to the trench using in situ steam generation, wherein the in situ steam generation formation of the oxide layer converts a portion of the silicon nitride layer into silicon dioxide and simultaneously rounds the upper corners of the silicon substrate.

2. The method of claim 1, wherein the in situ steam generation uses OH as the major oxidation source.

3. The method of claim 1, wherein the in situ steam generation includes hydrogen (H) radical content in the range of about 5% to 50%.

4. The method of claim 1, wherein the in situ steam generation is performed at a temperature above 900° C.

5. The method of claim 1, wherein the in situ steam generation includes H radical content of 33%.

6. The method of claim 1, wherein the in situ steam generation is performed at temperature of 1,050° C.

7. The method of claim 1, further comprising:
   forming a pad oxide layer over the silicon substrate;
   forming a pad mask layer over the pad oxide layer; and
   etching the pad oxide layer, pad mask layer, and silicon substrate to form the trench.

8. The method of claim 7, further comprising polishing the insulating layer using the mask layer as a polishing stop, and heating the silicon substrate in order to densify the insulating layer.

9. The method of claim 7, further comprising removing the pad oxide layer and the pad oxide layer from the areas adjacent to the trench.

10. The method of claim 9, further comprising etching the pad mask layer and etching the pad oxide layer, wherein the combination of etching the pad mask layer and etching the pad oxide layer produces recess cavities in the insulation layer at the top corners of the trench.

11. The method of claim 1, wherein the silicon nitride layer has a thickness in the range of approximately 10 to 100 angstroms.

12. The method of claim 1, wherein the silicon nitride layer is a $Si_3N_4$ layer.

13. The method of claim 1, wherein the pad mask layer is a silicon nitride layer.

14. In a semiconductor device comprising a silicon substrate, method for forming an isolation structure, comprising:
   forming a pad oxide layer on the substrate;
   forming a pad mask layer over the pad oxide layer;
   sequentially etching the pad mask layer, the pad oxide layer, and the substrate to form a trench;
   lining the trench with a liner oxide layer;
   further lining the trench with a silicon nitride layer;
   filling the lined trench with an insulating layer;
   forming a sacrificial oxide layer over the silicon substrate adjacent to the trench using in situ steam generation, wherein the in situ steam generation formation of the oxide layer converts a portion of the silicon nitride layer into silicon dioxide and simultaneously rounds the upper corners of the silicon substrate.

15. The method of claim 14, wherein the in situ steam generation uses OH as the major oxidation source.

16. The method of claim 14, wherein the in situ steam generation includes hydrogen (H) radical content in the range of about 5% to 50%.

17. The method of claim 14, wherein the in situ steam generation is performed at a temperature above 900° C.

18. The method of claim 14, wherein the in situ steam generation includes H radical content of 33%.

19. The method of claim 14, wherein the in situ steam generation is performed at temperature of 1,050° C.

20. The method of claim 14, further comprising polishing the insulating layer using the mask layer as a polishing stop, and heating the silicon substrate in order to densify the insulating layer.

21. The method of claim 20, further comprising removing the pad oxide layer and the pad oxide layer from the areas adjacent to the trench.

22. The method of claim 21, wherein removing the pad oxide layer and the pad mask layer comprises etching the pad mask layer and etching the pad oxide layer, and wherein the combination of etching the pad mask layer and etching the pad oxide layer produces recess cavities in the insulation layer at the top corners of the trench.

23. The method of claim 14, wherein the silicon nitride layer has a thickness in the range of approximately 10 to 100 angstroms.

24. The method of claim 14, wherein the silicon nitride layer is a $Si_3N_4$ layer.

25. The method of claim 14, wherein the pad mask layer is a silicon nitride layer.

* * * * *